United States Patent
Jo et al.

(10) Patent No.: US 11,527,207 B2
(45) Date of Patent: Dec. 13, 2022

(54) ELECTROLUMINESCENT DISPLAY DEVICE

(71) Applicant: LG DISPLAY CO., LTD., Seoul (KR)

(72) Inventors: JaeHyung Jo, Goyang-si (KR); WonHo Lee, Paju-si (KR); Wondoo Kim, Gimpo-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/465,477

(22) Filed: Sep. 2, 2021

(65) Prior Publication Data
US 2022/0076633 A1    Mar. 10, 2022

(30) Foreign Application Priority Data

Sep. 7, 2020 (KR) .......................... 10-2020-0114030

(51) Int. Cl.
*G09G 3/30* (2006.01)
*G09G 3/3266* (2016.01)

(52) U.S. Cl.
CPC ............. *G09G 3/3266* (2013.01); *G09G 3/30* (2013.01); *G09G 2300/0452* (2013.01);
(Continued)

(58) Field of Classification Search
CPC ...... G09G 3/30; G09G 3/3208; G09G 3/3233; G09G 3/3266; G09G 3/3275; G09G 2300/0426; G09G 2300/043; G09G 2300/0443; G09G 2300/0452; G09G 2300/0819; G09G 2300/0823; G09G 2310/0262; G09G 2310/0264; G09G 2320/0219; G09G 2320/0233;
(Continued)

(56) References Cited

U.S. PATENT DOCUMENTS

| 2012/0147065 A1* | 6/2012 | Byun | G09G 3/3208 345/77 |
| 2012/0268357 A1* | 10/2012 | Shih | G09G 3/3607 345/88 |

(Continued)

FOREIGN PATENT DOCUMENTS

| KR | 10-2005-0001956 A | 1/2005 |
| KR | 10-2015-0025489 A | 3/2015 |
| KR | 10-2015-0078573 A | 7/2015 |

*Primary Examiner* — Michael J Eurice
(74) *Attorney, Agent, or Firm* — Polsinelli PC

(57) ABSTRACT

An electroluminescent display device includes a display panel in which a plurality of pixels are disposed, each pixel including a first sub pixel, a second sub pixel, a third sub pixel, and a fourth sub pixel each having a different color; a data driver which supplies a data voltage to the plurality of pixels by means of a plurality of data lines; and a gate driver which supplies a gate signal to the plurality of pixels by means of a plurality of gate lines. Each of the plurality of data lines is divided into a plurality of sub data lines, and each of the plurality of sub data lines is connected to a plurality of sub pixels having the same color, the sub pixel includes a switching transistor, and a source electrode of the switching transistor includes a compensation pattern which is provided on at least one side of the source electrode spaced apart from the gate line, thereby improving luminance difference between sub pixels having the same color which are converted by the exposure overlay shift of the gate line.

19 Claims, 17 Drawing Sheets

(52) U.S. Cl.
CPC ............... *G09G 2300/0819* (2013.01); *G09G 2300/0823* (2013.01); *G09G 2320/0219* (2013.01); *G09G 2320/0233* (2013.01)

(58) Field of Classification Search
CPC ..... G09G 2320/0295; G09G 2320/043; G09G 2320/045; G09G 2320/0626; H01L 27/124; H01L 27/3213; H01L 27/3218; H01L 27/3272; H01L 27/3276; H01L 29/41733
See application file for complete search history.

(56) References Cited

U.S. PATENT DOCUMENTS

| | | | |
|---|---|---|---|
| 2015/0002775 A1* | 1/2015 | Chang | G02F 1/133512 349/110 |
| 2015/0036069 A1* | 2/2015 | Xue | H01L 27/1255 349/39 |
| 2016/0041664 A1* | 2/2016 | Qin | G06F 3/0412 345/173 |
| 2016/0246089 A1* | 8/2016 | Jeong | H01L 27/124 |
| 2018/0145121 A1* | 5/2018 | Park | H01L 27/3262 |
| 2018/0151123 A1* | 5/2018 | Li | G09G 3/3233 |
| 2018/0151649 A1* | 5/2018 | Han | H01L 51/50 |
| 2018/0182287 A1* | 6/2018 | Park | H01L 51/5206 |
| 2019/0392761 A1* | 12/2019 | Huang | G09G 3/3258 |
| 2020/0372869 A1* | 11/2020 | Yang | G09G 3/3688 |
| 2021/0193013 A1* | 6/2021 | Xu | H01L 27/3216 |
| 2022/0115483 A1* | 4/2022 | Li | H01L 27/3272 |

\* cited by examiner

| GRAY LEVEL | 16G | 32G | 64G | 128G | 255G |
|---|---|---|---|---|---|
| COMPARATIVE EMBODIMENT | 31.0% | 17.0% | 5.6% | 2.6% | 2.2% |
| EXPERIMENTAL EMBODIMENT 2 | 4.8% | 3.2% | 2.0% | 0.9% | 0.7% |

FIG. 14

ELECTROLUMINESCENT DISPLAY DEVICE

CROSS-REFERENCE TO RELATED APPLICATION

This application claims the priority of Korean Patent Application No. 10-2020-0114030 filed on Sep. 7, 2020, which is hereby incorporated by reference in its entirety.

BACKGROUND

Field of the Disclosure

The present disclosure relates to an electroluminescent display device, and more particularly, to an electroluminescent display device with a double rate driving (DRD) structure.

Description of the Background

Currently, as it enters a full-scale information era, a field of a display device which visually expresses electrical information signals has been rapidly developed and studies are continued to improve performances of various display devices such as a thin thickness, a light weight, and low power consumption.

As a representative display device, there are a liquid crystal display device (LCD), an electro-wetting display device (EWD), an organic light emitting display device (OLED), and the like.

Among them, an electroluminescent display device including an organic light emitting display device is a self-emitting display device so that a separate light source is not necessary, which is different from a liquid crystal display device. Therefore, the electroluminescent display device may be manufactured to have a light weight and a small thickness. Further, since the electroluminescent display device is advantageous not only in terms of power consumption due to the low voltage driving, but also in terms of color implementation, a response speed, a viewing angle, and a contrast ratio (CR), it is expected to be utilized in various fields.

The electroluminescent display device is configured by disposing a light emitting layer which uses an organic material between two electrodes referred to as an anode and a cathode. When holes in the anode are injected to the light emitting layer and electrons in the cathode are injected to the light emitting layer, the injected holes and electrons are recombined and form exciton in the light emitting layer to emit light.

Such a light emitting layer includes a host material and a dopant material so that interactions between two materials occur. The host serves to generate excitons from the electrons and holes and transmit energy to the dopant. The dopant is a dye-based organic material added in a small amount of dopant and serves to receive energy from the host and convert the energy into light.

Display devices are getting larger and perform double rate driving (DRD), especially, driven at a high speed of 120 Hz for the purpose of cost innovation (CI). In this case, 1 H time which is a pixel charging time is very short to be 1.85 μs so that various image quality problems are emerging.

As a structure for solving the above-mentioned problems, a 1S2L (one-source and two-data lines) technique which divides one data line into two sub data lines has been developed.

However, according to the 1S2L technique, basically, in adjacent sub pixels having the same color, gate lines for driving the sub pixels are divided up and down so that pixel driving circuits need to be inverted. Accordingly, during an exposure process, when an exposure overlay shift is generated in a vertical direction, different parasitic capacitances are applied to sub pixels having the same color which are inverted, so that as a result, bright/dark luminance defect is generated in every one line.

SUMMARY

Accordingly, the present disclosure is to provide an electroluminescent display device with a DRD structure which is capable of minimizing the influence of the parasitic capacitance between sub pixels having the same color which are inverted by exposure overlay shift.

In addition, the present disclosure is to provide an electroluminescent display device which is capable of improving a luminance difference between the inverted sub pixels having the same color.

The present disclosure is not limited to the above-mentioned features, which are not mentioned above, can be clearly understood by those skilled in the art from the following descriptions.

In order to achieve the above-described features, according to an aspect of the present disclosure, an electroluminescent display device includes: a display panel in which a plurality of pixels are disposed, each pixel including a first sub pixel, a second sub pixel, a third sub pixel, and a fourth sub pixel each having a different color; a data driver which supplies a data voltage to the plurality of pixels by means of a plurality of data lines; and a gate driver which supplies a gate signal to the plurality of pixels by means of a plurality of gate lines. Each of the plurality of data lines is divided into a plurality of sub data lines, and each of the plurality of sub data lines is connected to a plurality of sub pixels having the same color. The sub pixel includes a switching transistor, and a source electrode of the switching transistor may include a compensation pattern which is provided on at least one side of the source electrode spaced apart from the gate line.

According to another aspect of the present disclosure, an electroluminescent display device includes: a display panel in which a plurality of pixels are disposed, each pixel including a plurality of sub pixels having different colors; a data driver which supplies a data voltage to the plurality of pixels by means of a plurality of data lines; and a gate driver which supplies a gate signal to the plurality of pixels by means of a plurality of gate lines. Each of the plurality of data lines is divided into a plurality of sub data lines, and each of the plurality of sub data lines is connected to a plurality of sub pixels having the same color. The sub pixel includes a switching transistor, and a source electrode of the switching transistor includes a compensation pattern provided on at least one side of the source electrode spaced apart from the gate line. The compensation pattern may compensate for a difference of a parasitic capacitance generated between the gate line and the source electrode in accordance with a distance between the gate line and the source electrode between two adjacent sub pixels having the same color.

Other detailed matters of the exemplary aspects are included in the detailed description and the drawings.

According to the present disclosure, a luminance difference between the sub pixels having the same color which are inverted by exposure overlay shift may be improved, which may improve an image quality.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which:

FIG. 14 is a table illustrating a pixel current fluctuation rate according to a gray level.

DETAILED DESCRIPTION

Figure 1:
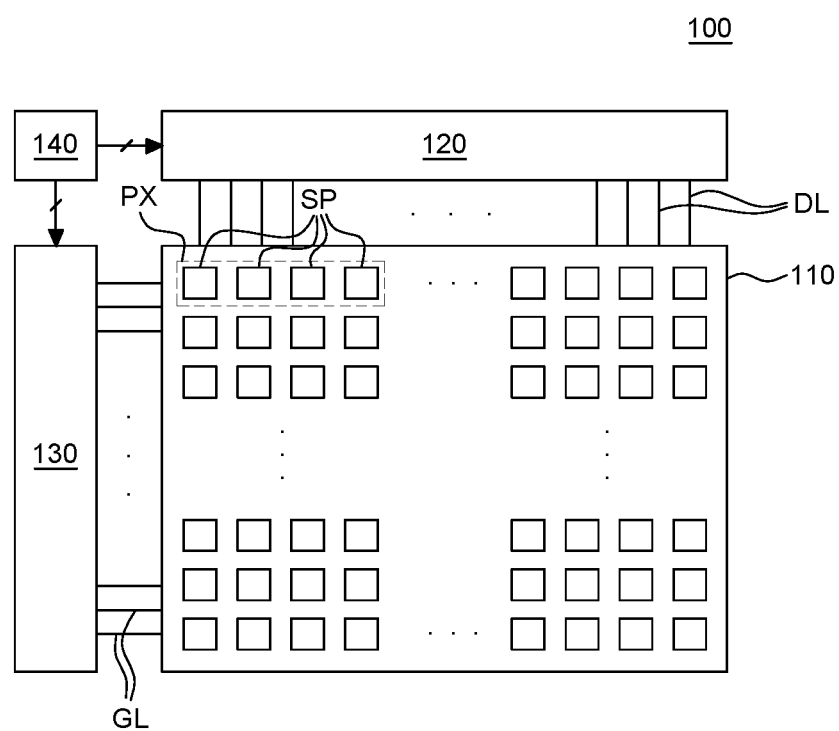
FIG. 1 is a schematic view of an electroluminescent display device according to an exemplary aspect of the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure can be partially or entirely adhered to or combined with each other and can be interlocked and operated in technically various ways, and the aspects can be carried out independently of or in association with each other.

A transistor used for an electroluminescent display device of the present disclosure may be implemented by one or more transistors among n-channel transistors (NMOS) and p-channel transistors (PMOS). The transistor may be implemented by an oxide semiconductor transistor having an oxide semiconductor as an active layer or an LTPS transistor having a low temperature poly-silicon (LTPS) as an active layer. The transistor may include at least a gate electrode, a source electrode, and a drain electrode. The transistor may be implemented by a thin film transistor (TFT) on a display panel. In a transistor, carriers flow from a source electrode to a drain electrode. In the case of the n-channel transistor (NMOS), since the carriers are electrons, in order to allow the electrons to flow from the source electrode to the drain electrode, a source voltage is lower than a drain voltage. A direction of the current in the n-channel transistor (NMOS) flows from the drain electrode to the source electrode and the source electrode may serve as an output terminal. In the case of the p-channel transistor (PMOS), since the carriers are holes, in order to allow the holes to flow from the source electrode to the drain electrode, a source voltage is higher than a drain voltage. In the p-channel transistor (PMOS), the holes flow from the source electrode to the drain electrode so that current flows from the source to the drain and the drain electrode may serve as an output terminal. Accordingly, the source and the drain may be switched in accordance with the applied voltage so that it should be noted that the source and the drain of the transistor are not fixed. In the present specification, it is assumed that the transistor is an n-channel transistor (NMOS), but is not limited thereto so that the p-channel transistor may be used and thus a circuit configuration may be changed.

A gate signal of transistors which are used as switching elements swings between a gate-on voltage and a gate-off voltage. The gate-on voltage is set to be higher than a threshold voltage Vth of the transistor and the gate-off voltage is set to be lower than the threshold voltage Vth of the transistor. The transistor is turned on in response to the gate-on voltage and is turned off in response to the gate-off voltage. In the case of the NMOS, the gate-on voltage is a gate high voltage VGH and the gate-off voltage may be a gate low voltage VGL. In the case of the PMOS, the gate-on voltage is a gate low voltage VGL and the gate-off voltage may be a gate high voltage VGH.

Hereinafter, various exemplary aspects of the present disclosure will be described in detail with reference to accompanying drawings.

FIG. 1 is a schematic view of an electroluminescent display device according to an exemplary aspect of the present disclosure.

Referring to FIG. 1, an electroluminescent display device 100 may include a display panel 110, a data driver 120, a gate driver 130, and a timing controller 140.

The display panel 110 is a panel for displaying images. The display panel 110 may include various circuits, wiring lines, and light emitting diodes disposed on the substrate. The display panel 110 may be divided by a plurality of data lines DL and a plurality of gate lines GL intersecting each other and may include a plurality of pixels PX connected to the plurality of data lines DL and the plurality of gate lines GL. The display panel 110 may include a display area defined by a plurality of pixels PX and a non-display area in which various signal lines, pads, or the like, are formed. The display panel 110 may be implemented by a display panel 110 used in various display devices such as a liquid crystal display device, an organic light emitting display device, or an electrophoretic display device. Hereinafter, it is described that the display panel 110 is a panel used in the organic light emitting display device, but is not limited thereto.

The timing controller 140 receives timing signals such as a vertical synchronization signal, a horizontal synchronization signal, a data enable signal, or a dot clock by means of a receiving circuit such as a low voltage differential signaling (LVDS) or transition minimized differential signaling (TMDS) interface connected to a host system. The timing controller 140 may generate timing control signals based on the input timing signal to control the gate driver 130 and the data driver 120.

The data driver 120 supplies a data voltage DATA to the plurality of sub pixels SP. The data driver 120 may include a plurality of source drive ICs (integrated circuits). The plurality of source drive ICs may be supplied with digital video data and a source timing control signal from the timing controller 140. The plurality of source drive ICs converts digital video data into a gamma voltage in response to the source timing control signal to generate a data voltage DATA and supply the data voltage DATA through the data line DL of the display panel 110. The plurality of source drive ICs may be connected to the data line DL of the display panel 110 by a chip on glass (COG) process or a tape automated bonding (TAB) process. Further, the source drive ICs are formed on the display panel 110 or are formed on a separate PCB substrate to be connected to the display panel 110.

The gate driver 130 supplies a gate signal to the plurality of sub pixels SP. The gate driver 130 may include a level shifter and a shift register. The level shifter shifts a level of a clock signal input at a transistor-transistor-logic (TTL) level from the timing controller 140 and then may supply the clock signal to the shift register. The shift register may be formed in the non-display area of the display panel 110, by a GIP manner, but is not limited thereto. The shift register may be configured by a plurality of stages which shifts the gate signal to output, in response to the clock signal and the driving signal. The plurality of stages included in the shift register sequentially outputs the gate signal through a plurality of output ends.

The display panel 110 may include a plurality of sub pixels SP. The plurality of sub pixels SP may be sub pixels for emitting different color light. For example, the plurality of sub pixels SP may be a red sub pixel, a green sub pixel, a blue sub pixel, and a white sub pixel, but is not limited thereto. The plurality of sub pixels SP may configure a pixel PX. That is, the red sub pixel, the green sub pixel, the blue sub pixel, and the white sub pixel configure one pixel PX and the display panel 110 may include a plurality of pixels PX.

Hereinafter, a driving circuit for driving one sub pixel SP will be described in more detail with reference to FIG. 2 together.

Figure 2:
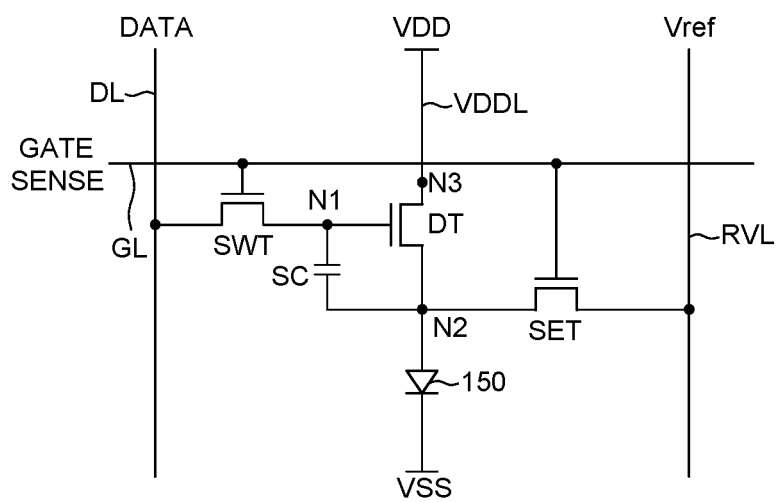
FIG. 2 is a circuit diagram of a sub pixel of an electroluminescent display device according to an exemplary aspect of the present disclosure.

FIG. 2 is a circuit diagram of a sub pixel of an electroluminescent display device according to an exemplary aspect of the present disclosure.

In FIG. 2, a circuit diagram for one sub pixel SP among the plurality of sub pixels SP of the electroluminescent display device 100 is illustrated.

Referring to FIG. 2, one sub pixel SP may include a switching transistor SWT, a sensing transistor SET, a driving transistor DT, a storage capacitor SC, and a light emitting diode 150.

The light emitting diode 150 may include an anode, an organic layer, and a cathode. The organic layer may include various layers such as a hole injection layer, a hole transport layer, an organic light emitting layer, an electron transport layer, and an electron injection layer. The anode of the light emitting diode 150 may be connected to an output terminal of the driving transistor DT and a low potential voltage VSS may be applied to the cathode. Even though in FIG. 2, it is described that the light emitting diode 150 is an organic light emitting diode 150, the present disclosure is not limited thereto so that as the light emitting diode 150, an inorganic light emitting diode, that is, an LED may also be used.

Further, referring to FIG. 2, the switching transistor SWT is a transistor which transmits the data voltage DATA to a first node N1 corresponding to a gate electrode of the driving transistor DT.

The switching transistor SWT may include a drain electrode connected to the data line DL, a gate electrode connected to the gate line GL, and a source electrode connected to the gate electrode of the driving transistor DT. The switching transistor SWT is turned on by a gate voltage GATE applied from the gate line GL to transmit a data voltage DATA supplied from the data line DL to the first node N1 corresponding to the gate electrode of the driving transistor DT.

Referring to FIG. 2, the driving transistor DT is a transistor which supplies a driving current to the light emitting diode 150 to drive the light emitting diode 150.

The driving transistor DT may include a gate electrode corresponding to the first node N1, a source electrode corresponding to a second node N2 and an output terminal, and a drain electrode corresponding to a third node N3 and an input terminal. Further, the gate electrode of the driving transistor DT is connected to the switching transistor SWT, the drain electrode is applied with a high potential voltage VDD by means of a high potential voltage line VDDL, and the source electrode may be connected to the anode of the light emitting diode 150.

Referring to FIG. 2, a storage capacitor SC is a capacitor which maintains a voltage corresponding to the data voltage DATA for one frame.

One electrode of the storage capacitor SC is connected to the first node N1 and the other electrode may be connected to the second node N2.

In the meantime, in the case of the electroluminescent display device 100, as the driving time of each sub pixel SP is increased, the circuit element such as the driving transistor DT may be degraded. Accordingly, a unique characteristic value of the circuit element such as a driving transistor DT may be changed. The unique characteristic value of the circuit element may include a threshold voltage Vth of the driving transistor DT or a mobility α of the driving transistor DT. The change in the characteristic value of the circuit element may cause a luminance change of the corresponding sub pixel SP. Accordingly, the change in the characteristic value of the circuit element may be used as the same concept as the luminance change of the sub pixel SP.

Further, the degree of the change in the characteristic values between circuit elements of each sub pixel SP may vary depending on a degree of degradation of each circuit element. Such a difference in the changing degrees of the characteristic values between the circuit elements may cause a luminance deviation between the sub pixels SP. Accordingly, the deviation in the characteristic value of the circuit element may be used as the same concept as the luminance deviation of the sub pixel SP. The change in the characteristic values of the circuit elements, that is, the luminance change of the sub pixel SP and the characteristic value deviation between the circuit elements, that is, the luminance deviation between the sub pixels SP may cause problems such as the lowering of the accuracy for luminance expressiveness of the sub pixel SP or screen abnormality.

Therefore, the sub pixel SP of the electroluminescent display device 100 according to the exemplary aspect of the present disclosure may provide a sensing function of sensing a characteristic value for the sub pixel SP and a compensating function of compensating for the characteristic value of the sub pixel SP using the sensing result.

Therefore, as illustrated in FIG. 2, the sub pixel SP may further include a sensing transistor SET to effectively control a voltage state of the source electrode of the driving transistor DT, in addition to the switching transistor SWT, the driving transistor DT, the storage capacitor SC, and the light emitting diode 150.

Referring to FIG. 2, the sensing transistor SET is connected between the source electrode of the driving transistor DT and the reference voltage line RVL which supplies a reference voltage Vref and a gate electrode may be connected to the gate line GL. Therefore, the sensing transistor SET is turned on by the sensing signal SENSE applied through the gate line GL to apply the reference voltage Vref which is supplied through the reference voltage line RVL to the source electrode of the driving transistor DT. Further, the sensing transistor SET may be utilized as one of voltage sensing paths for the source electrode of the driving transistor DT.

Referring to FIG. 2, for example, the switching transistor SWT and the sensing transistor SET of the sub pixel SP may share one gate line GL. That is, the switching transistor SWT and the sensing transistor SET are connected to the same gate line GL to be applied with the same gate signal, but is not limited thereto.

For the convenience of description, a voltage which is applied to the gate electrode of the switching transistor SWT is referred to as a gate voltage GATE and a voltage which is applied to the gate electrode of the sensing transistor SET is referred to as a sensing signal SENSE. However, the gate voltage GATE and the sensing signal SENSE applied to one sub pixel SP are the same signal which is transmitted from the same gate line GL.

However, the present disclosure is not limited thereto so that only the switching transistor SWT may be connected to the gate line GL and the sensing transistor SET may be connected to a separate sensing line. In this case, the gate voltage GATE may be applied to the switching transistor SWT through the gate line GL and the sensing signal SENSE may be applied to the sensing transistor SET through the sensing line.

Accordingly, the reference voltage Vref is applied to the source electrode of the driving transistor DT by means of the sensing transistor SET. Further, a voltage for sensing the threshold voltage Vth of the driving transistor DT or the mobility α of the driving transistor DT is detected by the reference voltage line RVL. Further, the data driver 120 may compensate for the data voltage DATA in accordance with a variation of the threshold voltage Vth of the driving transistor DT or the mobility α of the driving transistor DT.

Hereinafter, a placement relationship of the plurality of sub pixels will be described with reference to FIG. 3.

Figure 3:
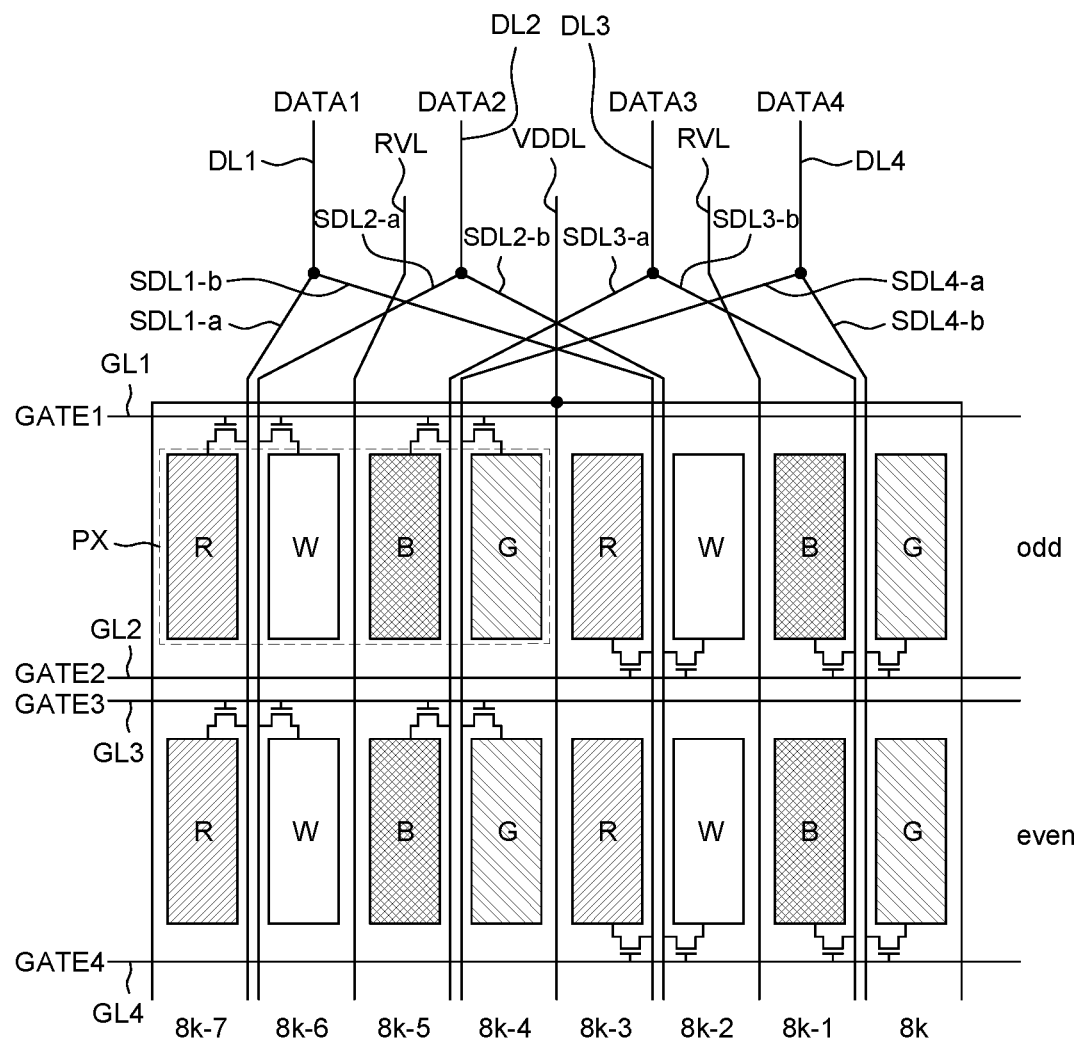
FIG. 3 is a view for explaining a placement relationship of sub pixels of an electroluminescent display device according to an exemplary aspect of the present disclosure.

FIG. 3 is a view for explaining a placement relationship of sub pixels of an electroluminescent display device according to an exemplary aspect of the present disclosure.

In FIG. 3, for the convenience of description, even though only four pixels PX which are disposed in a 2×2 matrix are illustrated, actually, in the display area, the placement relationship of four pixels PX disposed in a 2×2 matrix may be repeated. Further, the transistor disposed between the sub pixels R, G, B, and W and the data lines DL1, DL2, DL3, and DL4 refers to the switching transistor SWT described with reference to FIG. 2.

Referring to FIG. 3, one pixel PX includes four sub pixels R, G, B, and W. For example, as illustrated in FIG. 3, the pixel PX may include a first sub pixel R, a second sub pixel W, a third sub pixel B, and a fourth sub pixel G. Further, the first sub pixel R is a red sub pixel, the second sub pixel W is a white sub pixel, the third sub pixel B is a blue sub pixel, and the fourth sub pixel G may be a green sub pixel. However, the present disclosure is not limited thereto and the plurality of sub pixels R, G, B, and W may be changed to various colors such as magenta, yellow, and cyan.

Further, the plurality of same color sub pixels R, G, B, and W may be disposed in the same column. That is, a plurality of first sub pixels R is disposed in the same column, a plurality of second sub pixels W is disposed in the same column, a plurality of third sub pixels B is disposed in the same column, and a plurality of fourth sub pixels G may be disposed in the same column.

To be more specific, as illustrated in FIG. 3, the plurality of first sub pixels R is disposed in a 8k-7th column and a 8k-3rd column and the plurality of second sub pixels W is disposed in a 8k-6th column and a 8k-2nd column. Further, the plurality of third sub pixels B is disposed in a 8k-5th column and a 8k-1st column and the plurality of fourth sub pixels G is disposed in a 8k-4th column and a 8k-th column. Here, k refers to a natural number of 1 or larger.

The first sub pixels R, the second sub pixels W, the third sub pixels B, and the fourth sub pixels G may be sequentially repeated with respect to one odd-numbered row or one even-numbered row.

Further, a plurality of data lines DL1, DL2, DL3, and DL4 may be divided into a plurality of sub data lines SDL1-a, SDL1-b, SDL2-a, SDL2-b, SDL3-a, SDL3-b, SDL4-a, and SDL4-b, respectively. Specifically, the first data line DL1 may be divided into a plurality of first sub data lines SDL1-a and SDL1-*b* and the second data line DL2 may be divided into a plurality of second sub data lines SDL2-*a* and SDL2-*b*. Further, the third data line DL3 may be divided into a plurality of third sub data lines SDL3-*a* and SDL3-*b* and the fourth data line DL4 may be divided into a plurality of fourth sub data lines SDL4-*a* and SDL4-*b*.

The first sub data lines SDL1-*a* and SDL1-*b* may include a 1-*a*-th sub data line SDL1-*a* and a 1-*b*-th sub data line SDL1-*b* and the second sub data lines SDL2-*a* and SDL2-*b* may include a 2-*a*-th sub data line SDL2-*a* and a 2-*b*-th sub data line SDL2-*b*. Further, the third sub data lines SDL3-*a* and SDL3-*b* may include a 3-*a*-th sub data line SDL3-*a* and a 3-*b*-th sub data line SDL3-*b* and the fourth sub data lines SDL4-*a* and SDL4-*b* may include a 4-*a*-th sub data line SDL4-*a* and a 4-*b*-th sub data line SDL4-*b*.

Further, the plurality of first sub data lines SDL1-*a* and SDL1-*b* is disposed to be adjacent to the plurality of first sub pixels R to be connected to the plurality of first sub pixels R.

Specifically, the 1-*a*-th sub data line SDL1-*a* is disposed between the plurality of first sub pixels R disposed in the 8k-7-th column and the plurality of second sub pixels W disposed in the 8k-6-th column to be electrically connected to the plurality of first sub pixels R disposed in the 8k-7-th column. Specifically, the 1-*b*-th sub data line SDL1-*b* is disposed between the plurality of first sub pixels R disposed in the 8k-3rd column and the plurality of second sub pixels W disposed in the 8k-2nd column to be electrically connected to the plurality of first sub pixels R disposed in the 8k-3rd column.

Further, the plurality of second sub data lines SDL2-*a* and SDL2-*b* is disposed to be adjacent to the plurality of second sub pixels W to be connected to the plurality of second sub pixels W.

Specifically, a 2-*a*-th sub data line SDL2-*a* is disposed between a plurality of first sub pixels R disposed in the 8k-7th column and the plurality of second sub pixels W disposed in the 8k-6th column to be electrically connected to the plurality of second sub pixels W disposed in the 8k-6th column. Specifically, the 2-*b*-th sub data line SDL2-*b* is disposed between the plurality of first sub pixels R disposed in the 8k-3rd column and the plurality of second sub pixels W disposed in the 8k-2nd column to be electrically connected to the plurality of second sub pixels W disposed in the 8k-2nd column.

Further, the plurality of third sub data lines SDL3-*a* and SDL3-*b* is disposed to be adjacent to the plurality of third sub pixels B to be connected to the plurality of third sub pixels B.

Specifically, the 3-*a*-th sub data line SDL3-*a* is disposed between the plurality of third sub pixels B disposed in the 8k-5th column and the plurality of fourth sub pixels G disposed in the 8k-4th column to be electrically connected to the plurality of third sub pixels B disposed in the 8k-5th column. Further, the 3-*b*-th sub data line SDL3-*b* is disposed between the plurality of third sub pixels B disposed in the 8k-1st column and the plurality of fourth sub pixels G disposed in the 8k-th column to be electrically connected to the plurality of third sub pixels B disposed in the 8k-1st column.

Further, the plurality of fourth sub data lines SDL4-*a* and SDL4-*b* is disposed to be adjacent to the plurality of fourth sub pixels G to be connected to the plurality of fourth sub pixels G.

Specifically, the 4-*a*-th sub data line SDL4-*a* is disposed between the plurality of third sub pixels B disposed in the 8k-5th column and the plurality of fourth sub pixels G disposed in the 8k-4th column to be electrically connected to the plurality of fourth sub pixels G disposed in the 8k-4th column. Further, the 4-*b*-th sub data line SDL4-*b* is disposed between the plurality of third sub pixels B disposed in the 8k-1st column and the plurality of fourth sub pixels G disposed in the 8k-th column to be electrically connected to the plurality of fourth sub pixels G disposed in the 8k-th column.

Further, a first data voltage DATA1 which is a red data voltage may be applied to the first data line DL1 and a second data voltage DATA2 which is a white data voltage may be applied to the second data line DL2. Further, a third data voltage DATA3 which is a blue data voltage may be applied to the third data line DL3 and a fourth data voltage DATA4 which is a green data voltage may be applied to the fourth data line DL4.

Therefore, the first data voltage DATA1 which is a red data voltage may be applied to the plurality of first sub data lines SDL1-*a* and SDL1-*b* and the second data voltage DATA2 which is a white data voltage may be applied to the plurality of second sub data line SDL2-*a* and SDL2-*b*. Further, the third data voltage DATA3 which is a blue data voltage may be applied to the plurality of third sub data lines SDL3-*a* and SDL3-*b* and the fourth data voltage DATA4 which is a green data voltage may be applied to the plurality of fourth sub data lines SDL4-*a* and SDL4-*b*.

Each of the plurality of gate lines GL1 to GL4 may be disposed on both sides of the plurality of sub pixels R, G, B, and W, and two gate lines GL2 and GL3 may be disposed between the plurality of sub pixels R, G, B, and W.

Specifically, referring to FIG. 3, the first gate line GL1 and the second gate line GL2 are disposed on both sides of the plurality of sub pixels R, G, B, and W in the odd-numbered rows and the third gate line GL3 and the fourth gate line GL4 may be disposed on both sides of the plurality of sub pixels R, G, B, and W in the even-numbered rows. Therefore, the second gate line GL2 and the third gate line GL3 may be disposed between the plurality of sub pixels R, G, B, and W in the odd-numbered rows and the plurality of sub pixels R, G, B, and W in the even-numbered rows.

The sub pixels included in a single pixel may be connected to the same gate line, and the sub pixels included in adjacent pixels PX among the plurality of pixels PX may be connected to different gate lines.

Specifically, referring to FIG. 3, the sub pixels R, W, B, and G included in a pixel PX disposed in the 8k-7th column to 8k-4th column of the odd-numbered row may be connected to the first gate line GL1. Further, the sub pixels R, W, B, and G included in a pixel PX disposed in the 8k-3rd column to 8k-th column of the odd-numbered row may be connected to the second gate line GL2. Further, the sub pixels R, W, B, and G included in a pixel PX disposed in the 8k-7th column to 8k-4th column of the even-numbered row may be connected to the third gate line GL3. Further, the sub pixels R, W, B, and G included in a pixel PX disposed in the 8k-3rd column to 8k-th column of the even-numbered row may be connected to the fourth gate line GL4.

Further, each of the plurality of reference voltage lines RVL is disposed in one pixel PX and each of the plurality of high potential voltage lines VDDL may be disposed between the plurality of adjacent pixels PX.

Specifically, the plurality of reference voltage lines RVL is disposed between the plurality of second sub pixels W disposed in the 8k-6th column and the plurality of third sub pixels B disposed in the 8k-5th column and disposed between the plurality of second sub pixels W disposed in the 8k-2rd column and the plurality of third sub pixels B disposed in the 8k-1st column.

The plurality of high potential voltage lines VDDL is disposed between the plurality of fourth sub pixels G disposed in the 8k-4th column and the plurality of first sub pixels R disposed in the 8k-3rd column and disposed at the outside of the plurality of first sub pixels R disposed in the 8k-7th column and at the outside of the plurality of fourth sub pixels G disposed in the 8k-th column.

In an electroluminescent display device 100 with a double rate driving (DRD) structure to which a 1S2L (one-source two-data lines) technique is applied, gate lines GL1 to GL4 are divided up and down between adjacent sub pixels SP having the same color so that driving circuits between the sub pixels SP are inverted. Further, when the exposure overlay shift is generated, different parasitic capacitances are applied between the inverted sub pixels SP having the same color so that bright/dark luminance defect is generated at every line. That is, during the exposure process, when the exposure overlay shift is generated, the parasitic capacitance between the gate lines GL1 to GL4 and the source electrode of the switching transistor SWT between adjacent sub pixels SP having the same color may vary.

Accordingly, in the present disclosure, a compensation pattern is formed on both sides of the source electrode of the switching transistor SWT to compensate for the influence of the parasitic capacitance which is inversely proportional to the distance from the gate lines GL1 to GL4. By doing this, the luminance difference between the sub pixels SP having the same color which are inverted by the exposure overlay shift may be improved.

For reference, according to the existing structure, the luminance difference at a low gray level is 17%.

Figure 4:
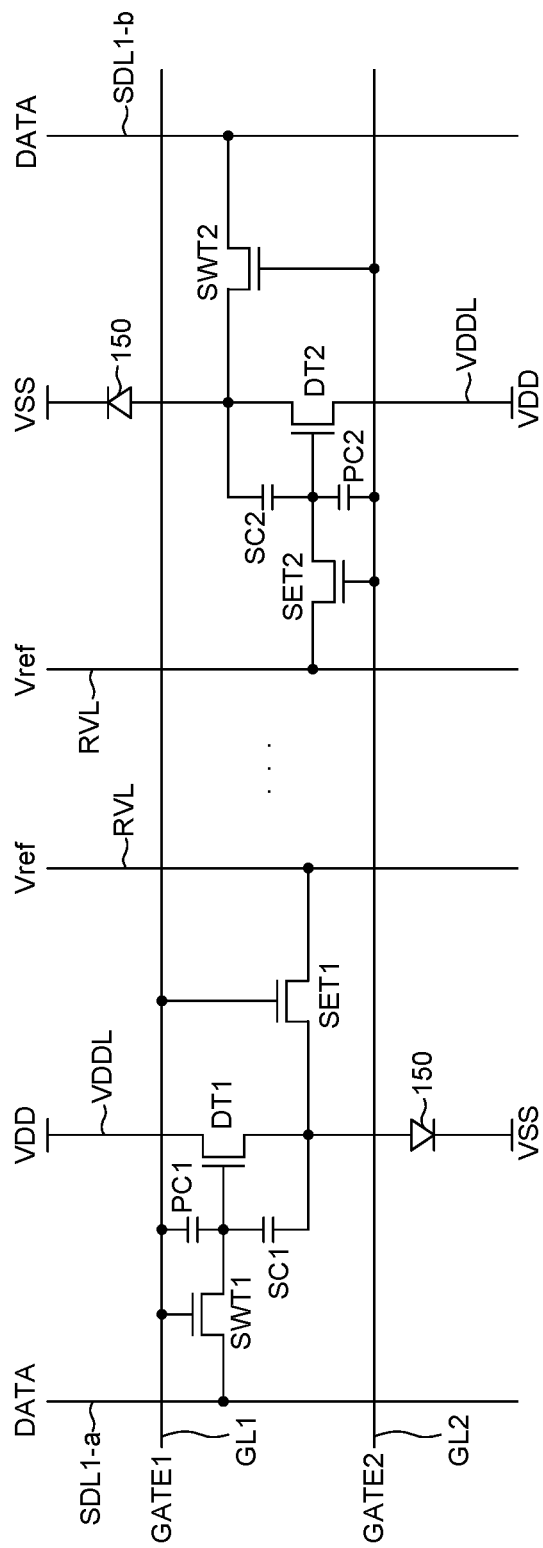
FIG. 4 is a circuit diagram of two sub pixels of an electroluminescent display device according to an exemplary aspect of the present disclosure.

FIG. 4 is a circuit diagram of two sub pixels of an electroluminescent display device according to an exemplary aspect of the present disclosure.

Figure 5A:
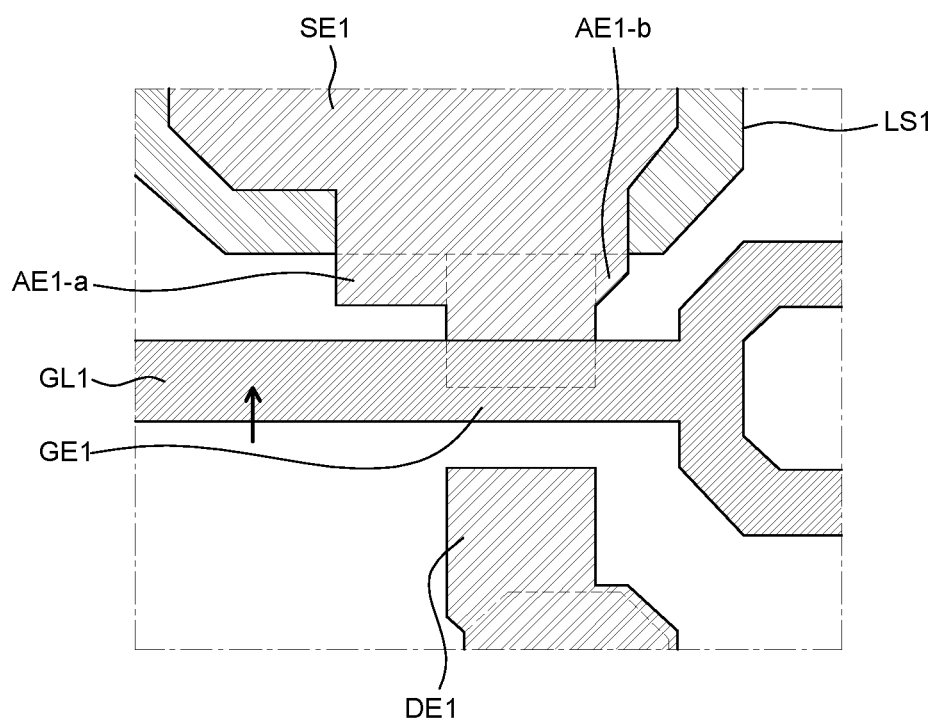
FIGS. 5A and 5B are plan views enlarging a part of a sub pixel.
Figure 5B:
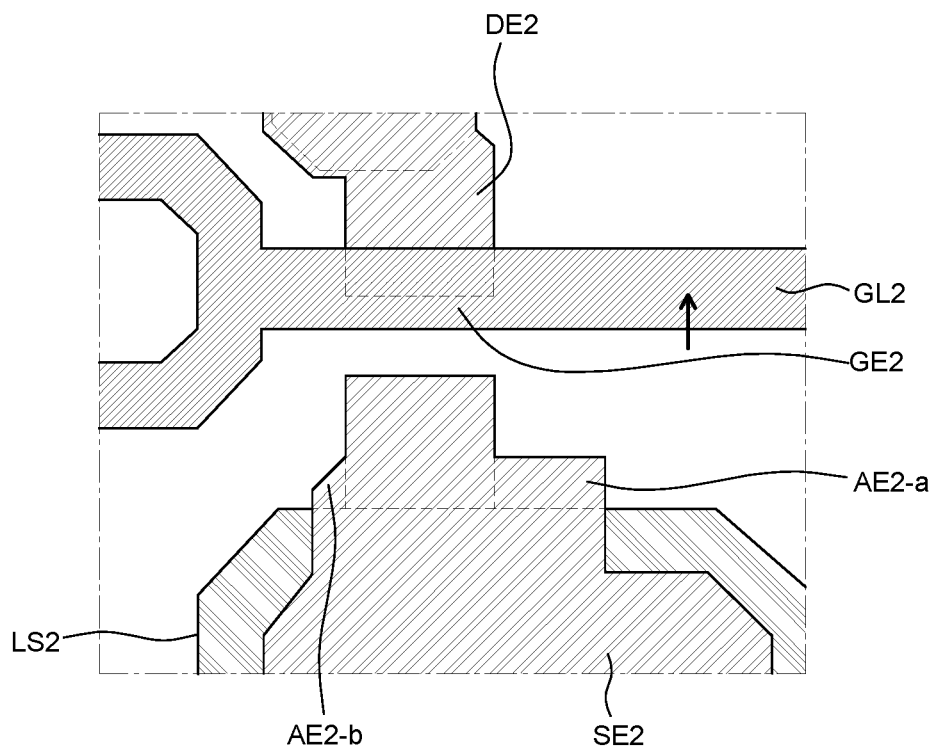

FIGS. 5A and 5B are plan views enlarging a part of a sub pixel.

FIG. 4 illustrates two adjacent sub pixels SP having the same color. That is, for example, a first sub pixel R (hereinafter, for the convenience of description, referred to as a (1,1)-th sub pixel) disposed in the 8k-7th column of the odd-numbered row of FIG. 3 and a first sub pixel R (hereinafter, for the convenience of description, referred to as a (5,1)-th sub pixel) disposed in the 8k-3rd column of the odd-numbered row are illustrated.

FIG. 5A illustrates the periphery of a switching transistor SWT1 of the (1,1)-th sub pixel of FIG. 4 and FIG. 5B enlarges the periphery of a switching transistor SWT2 of the (5,1)-th sub pixel of FIG. 4.

Referring to FIGS. 4, 5A, and 5B, the (1,1)-th sub pixel may include a first switching transistor SWT1, a first sensing transistor SET1, a first driving transistor DT1, a first storage capacitor SC1, and a light emitting diode 150.

At this time, the first switching transistor SWT1 may include a first drain electrode DE1 connected to a 1-*a*-th sub data line SDL1-*a*, a first gate electrode GE1 connected to the first gate line GL1, and a first source electrode SE1 connected to a first gate electrode of the first driving transistor DT1.

Further, the (5,1)-th sub pixel may include a second switching transistor SWT2, a second sensing transistor SET2, a second driving transistor DT2, a second storage capacitor SC2, and a light emitting diode 150.

At this time, the second switching transistor SWT2 may include a second drain electrode DE2 connected to a 1-*b*-th sub data line SDL1-*b*, a second gate electrode GE2 connected to the second gate line GL2, and a second source electrode SE2 connected to a second gate electrode of the second driving transistor DT2.

As described above, two adjacent sub pixels SP having the same color, that is, for example, the (1,1)-th sub pixel and the (5,1)-th sub pixel are connected to the first gate line GL1 and the second gate line GL2 which are divided up and down, respectively, so that the driving circuits of the sub pixels SP are inverted. That is, in the (1,1)-th sub pixel, the first source electrode SE1 is disposed on the first gate line GL1 and the first drain electrode DE1 is disposed below the first gate line GL1. In contrast, in the (5,1)-th sub pixel, the second drain electrode DE2 is disposed on the second gate line GL2 and the second source electrode SE2 is disposed below the second gate line GL2.

Therefore, when the exposure overlay shift of the gate lines GL1 and GL2 is generated, that is, for example, the gate lines GL1 and GL2 are formed to be higher than a designed position, in the (1,1)-th sub pixel, the first gate line GL1 is closer to the first source electrode SE1. In contrast, in the (5,1)-th sub pixel, a distance between the second gate line GL2 and the second source electrode SE2 is increased.

Accordingly, a magnitude of the second parasitic capacitance PC2 generated between the second gate line GL2 and the second source electrode SE2 is different from a magnitude of the first parasitic capacitance PC1 generated between the first gate line GL1 and the first source electrode SE1.

That is, the second parasitic capacitance PC2 generated between the second gate line GL2 and the second source electrode SE2 is larger than the first parasitic capacitance PC1 generated between the first gate line GL1 and the first source electrode SE1.

Therefore, according to the present disclosure, first compensation patterns AE1-*a* and AE1-*b* are formed on both sides of the first source electrode SE1 and second compensation patterns AE2-*a* and AE2-*b* are formed on both sides of the second source electrode SE2.

In the meantime, a first light shielding layer LS1 and a second light shielding layer LS2 may be disposed below the first source electrode SE1 and the second source electrode SE2, respectively, and an anode (not illustrated) may be disposed thereon. The first compensation patterns AE1-*a* and AE1-*b* and the second compensation patterns AE2-*a* and AE2-*b* may be disposed on side surfaces of the first source electrode SE1 and the second source electrode SE2 which do not overlap the first light shielding layer LS1 and the second light shielding layer LS2. Portions of the first and second source electrodes SE1 and SE2 which overlap the first and second light shielding layers LS1 and LS2 and the anode are shielded by the first and second light shielding layers LS1 and LS2 and the anode. In contrast, portions of the first and second source electrodes SE1 and SE2 which do not overlap the first and second light shielding layers LS1 and LS2 and the anode, that is, are exposed may be involved in the first and second parasitic capacitances PC1 and PC2 of the first and second gate lines GL1 and GL2 by a fringe field.

Further, the first compensation patterns AE1-*a* and AE1-*b* and the second compensation patterns AE2-*a* and AE2-*b* may be formed at the most possible position where the exposure overlay shift of the first gate line GL1 and the second gate line GL2 may occur to be spaced apart from the first gate line GL1 and the second gate line GL2. However, it is not limited thereto.

At this time, the first compensation patterns AE1-*a* and AE1-*b* may include a 1-*a*-th compensation pattern AE1-*a* formed at a right side of the first source electrode SE1 and a 1-*b*-th compensation pattern AE1-*b* formed at a left side of the first source electrode SE1.

Further, the second compensation patterns AE2-*a* and AE2-*b* may include a 2-*a*-th compensation pattern AE2-*a* formed at a left side of the second source electrode SE2 and a 2-*b*-th compensation pattern AE2-*b* formed at a right side of the second source electrode SE2, but the present disclosure is not limited thereto.

The 1-*a*-th compensation pattern AE1-*a* and the 2-*a*-th compensation pattern AE2-*a* may have the same shape and the 1-*b*-th compensation pattern AE1-*b* and the 2-*b*-th compensation pattern AE2-*b* may have the same shape, but the present disclosure is not limited thereto.

In FIGS. 5A and 5B, it is illustrated that the 1-*a*-th compensation pattern AE1-*a* and the 2-*a*-th compensation pattern AE2-*a* are larger than the 1-*b*-th compensation pattern AE1-*b* and the 2-*b*-th compensation pattern AE2-*b*, but the present disclosure is not limited thereto.

For example, widths of the first compensation patterns AE1-*a* and AE1-*b* and the second compensation patterns AE2-*a* and AE2-*b* may be approximately 6.5 μm to 7.0 μm, but the present disclosure is not limited thereto.

Hereinafter, the change in the parasitic capacitance due to the exposure overlay shift of the gate line and the compensation by the compensation pattern will be described in detail with reference to the drawings.

Figure 6A:
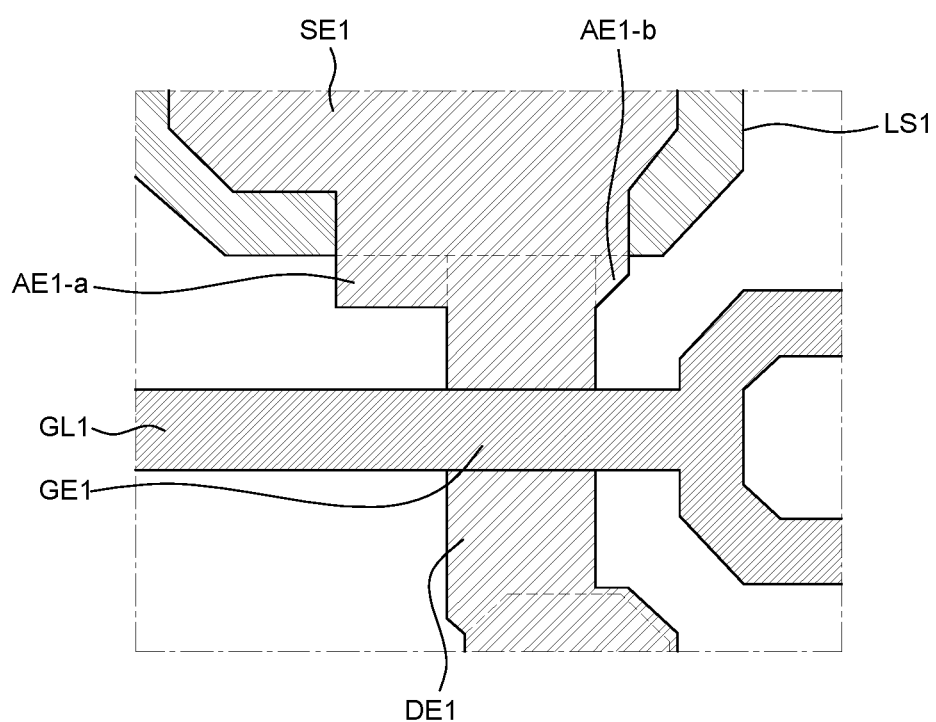
FIGS. 6A to 6C are plan views for explaining a change in a parasitic capacitance due to exposure overlay shift.
Figure 6B:
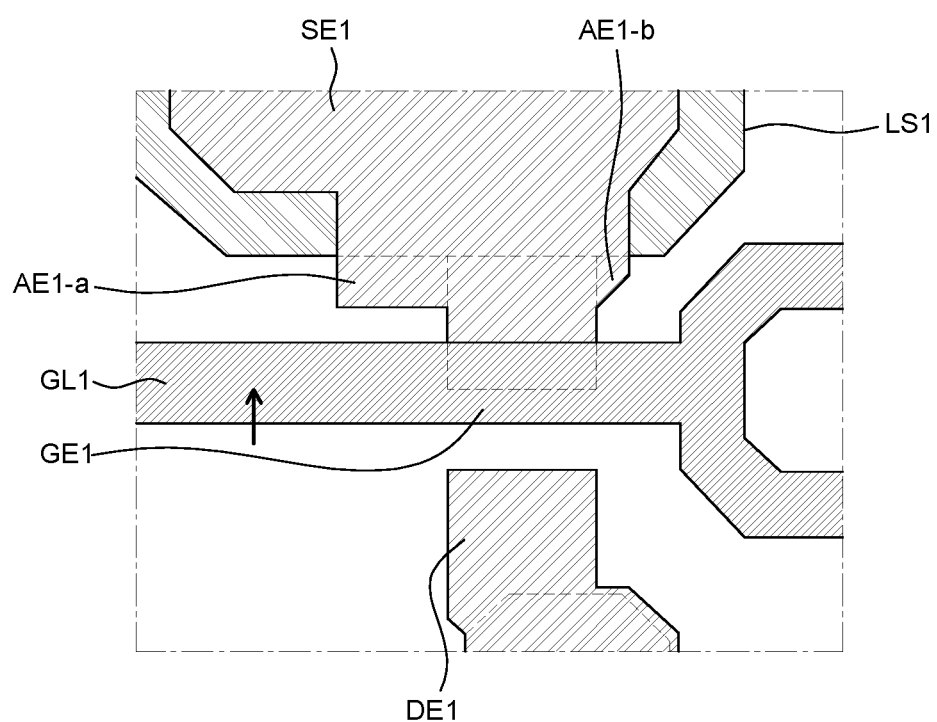
Figure 6C:
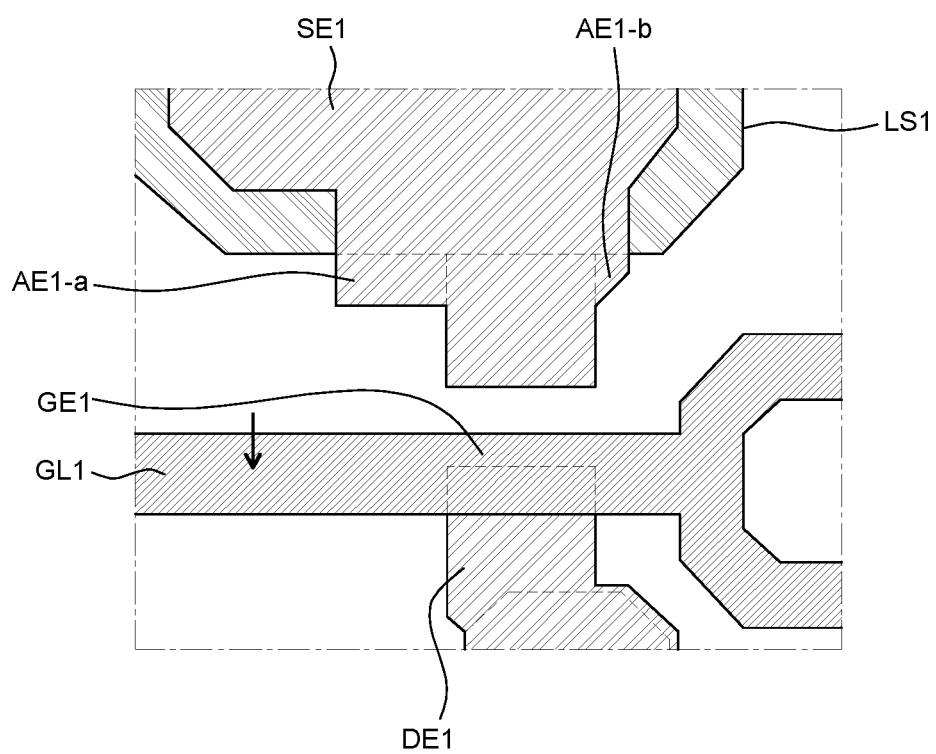

FIGS. 6A to 6C are plan views for explaining a change in a parasitic capacitance due to exposure overlay shift.

FIGS. 6A to 6C illustrate a (1,1)-th sub pixel as an example.

FIG. 6A illustrates that the first gate line GL1 is formed in a set position, FIG. 6B illustrates that the first gate line GL1 is formed to be moved up by 2 μm from the set position, and FIG. 6C illustrates that the first gate line GL1 is formed to be moved down by 2 μm from the set position.

Referring to FIGS. 6A and 6B, it may be understood that when the first gate line GL1 is formed to be moved up from the set position, the distance between the first gate line GL1 and the first source electrode SE1 in the (1,1)-th sub pixel is closer. In this case, the parasitic capacitance between the first gate line GL1 and the first source electrode SE1 is reduced, but the first compensation patterns AE1-*a* and AE1-*b* are formed on both sides of the first source electrode SE1 to additionally form a parasitic capacitance with the first gate line GL1. Therefore, the reduced parasitic capacitance may be compensated.

In contrast, referring to FIGS. 6A and 6C, it may be understood that when the first gate line GL1 is formed to be moved down from the set position, the distance between the first gate line GL1 and the first source electrode SE1 is increased. In this case, the parasitic capacitance between the first gate line GL1 and the first source electrode SE1 is increased, but the distance between the first compensation patterns AE1-*a* and AE1-*b* and the first gate line GL1 is increased so that as compared with FIG. 6B, the contribution to the parasitic capacitance may be reduced.

Accordingly, when the widths of the first compensation patterns AE1-*a* and AE1-*b* are set in consideration of the parasitic capacitance compensated by the first compensation patterns AE1-*a* and AE1-*b*, the influence of the parasitic capacitance between the sub pixels SP having the same color which are inverted by the exposure overlay shift may be minimized.

In the meantime, it is impractical to compensate for all the larger number of parasitic capacitances, but a parasitic capacitance between the gate line and the source electrode among them is important, which will be described in detail with reference to the drawings.

Figure 7:
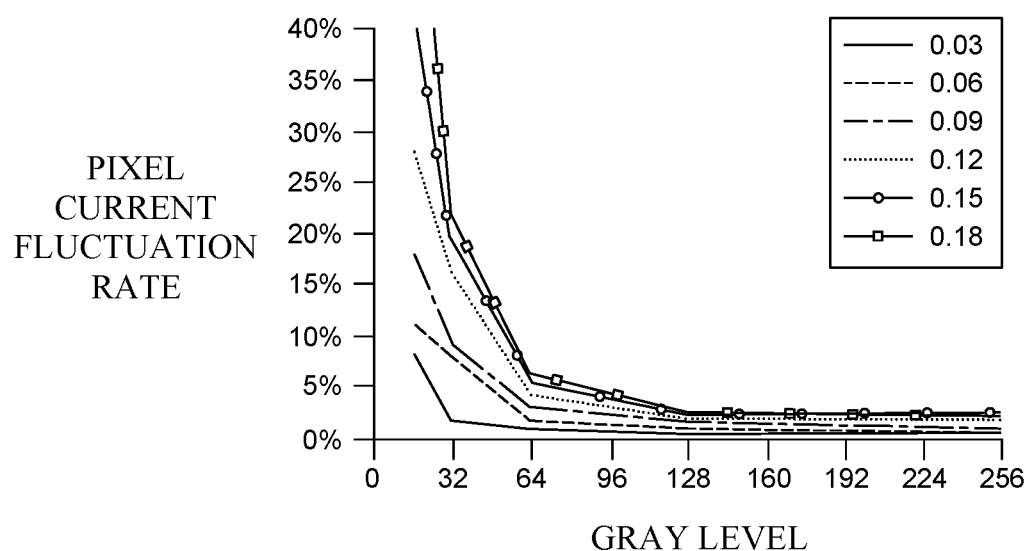
FIGS. 7 to 9 are graphs illustrating a pixel current fluctuation rate according to a gray level.
Figure 8:
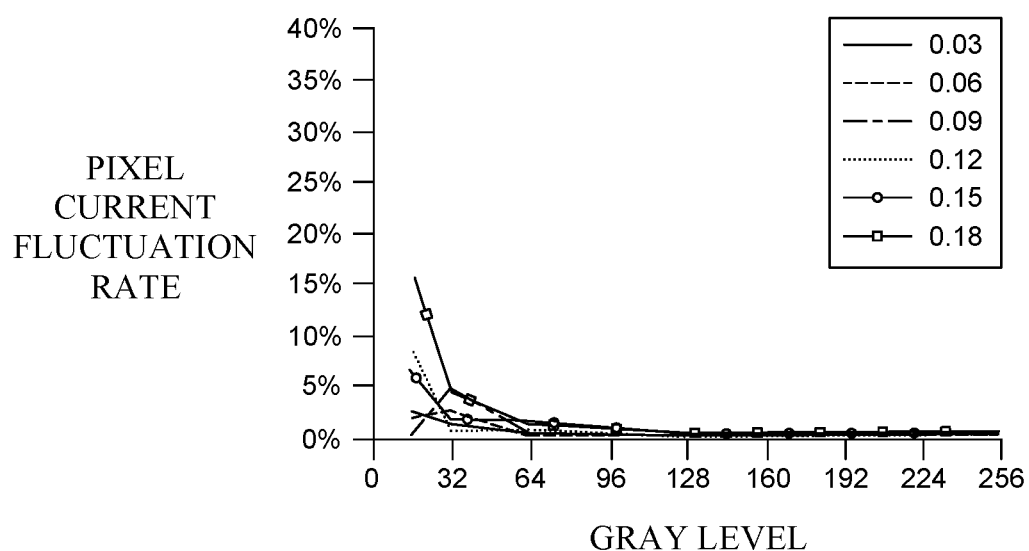
Figure 9:
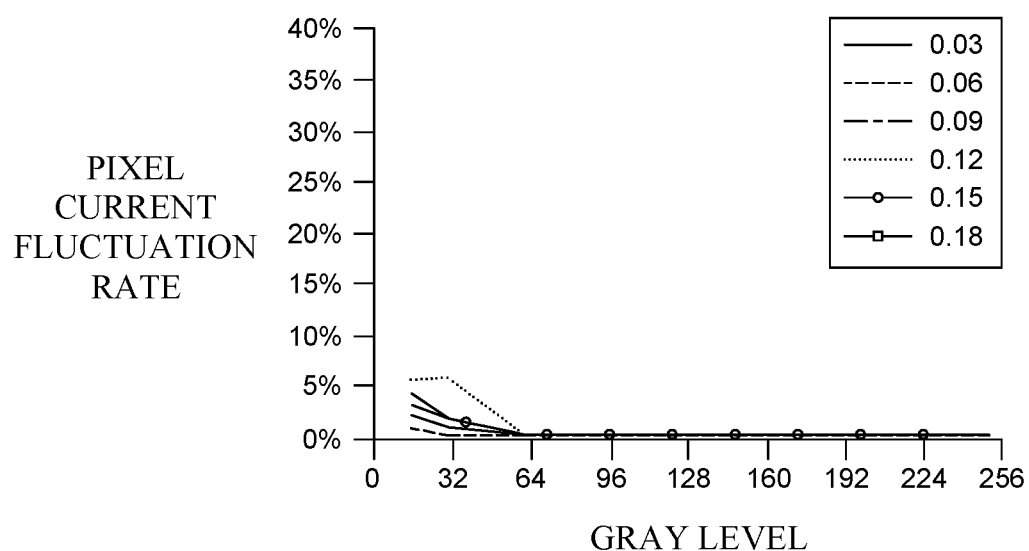

FIGS. 7 to 9 are graphs illustrating a pixel current fluctuation rate according to a gray level.

FIGS. 7 to 9 illustrate a fluctuation rate of a pixel current per gray level, in accordance with a parasitic capacitance variation, from 16 gray levels to 256 gray levels.

For example, FIGS. 7 to 9 illustrate a fluctuation rate of the pixel current per gray level when the parasitic capacitance is changed by 0.03, 0.06, 0.09, 0.12, 0.15, and 0.18.

FIG. 7 illustrates a result of a parasitic capacitance between a gate line and a source electrode, FIG. 8 illustrates a result of a parasitic capacitance between a low potential voltage line and a source electrode, and FIG. 9 illustrates a result of a parasitic capacitance between a high potential voltage line and a source electrode.

Referring to FIGS. 7 to 9, in all cases, it may be understood that in all cases, the lower the gray level, the larger the fluctuation rate of the pixel current and except for FIG. 9, the larger the change in the parasitic capacitance, the larger the fluctuation rate of the pixel current.

Accordingly, it may be understood that the parasitic capacitance between the gate line and the source electrode is more dominant for the variation of the pixel current than the other parasitic capacitance. Specifically, it may be understood that at a low gray level which is 32 gray levels or lower, the change in the parasitic capacitance between the gate line and the source electrode is very sensitive to the variation of the pixel current.

Figure 10:
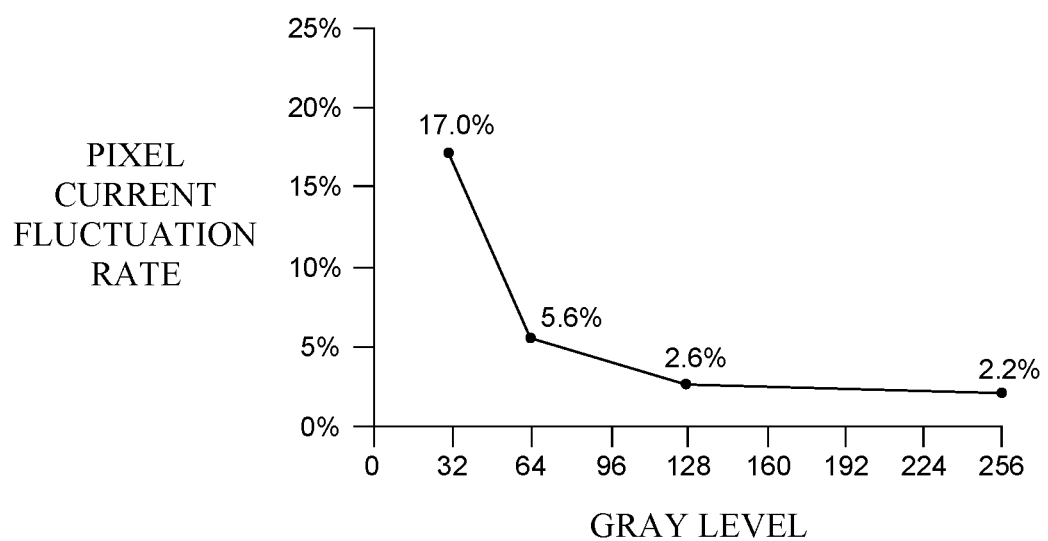
FIG. 10 is a graph illustrating a pixel current fluctuation rate according to a gray level.

FIG. 10 is a graph illustrating a pixel current fluctuation rate according to a gray level.

FIG. 10 illustrates a pixel current fluctuation rate per gray level of a red sub pixel.

Referring to FIG. 10, it may be understood that when the overlay shift of the gate line is generated, the pixel current varies due to the difference of the parasitic capacitance between the gate line and the source electrode between the adjacent sub pixels having the same color.

Further, it may be further understood that the lower the gray level, the larger the pixel current fluctuation rate. For example, in 64 gray levels, the pixel current fluctuation rate is 5.6%, but in 32 gray levels, the pixel current fluctuation rate increases to 17.0%. That is, it may be understood that the luminance difference is 17% in a low gray level.

In the meantime, for example, when the storage capacitance is 11.37 fF, the parasitic capacitance variation between the gate line and the source electrode in accordance with the overlay shift is as follows.

It may be understood that when the overlay shift is not generated, the parasitic capacitance is 1.08 fF, but the overlay shift of the gate line is generated by +2 μm (see FIG. 6B) and −2 μm (see FIG. 6C) to the source electrode direction, the parasitic capacitances are 1.02 fF and 1.14 fF, respectively. That is, it may be understood that the closer the gate line to the source electrode, the smaller the parasitic capacitance and the farther from the source electrode, the larger the parasitic capacitance.

At this time, the difference between the storage capacitance and the parasitic capacitance is −0.06 and +0.06 and for example, it may be understood that the overlay shift of the gate line is generated by +2 μm to the source electrode, the parasitic capacitance fluctuation rate between adjacent sub pixels having the same color is 1.06%.

In the meantime, according to the present disclosure, it may be understood that the luminance difference is improved to be less than 5% by forming the compensation patterns on both sides of the source electrode and when the difference is converted to a gray level, it is less than one gray level, which is unrecognizable with the naked eye.

The compensation pattern does not overlap the light shielding layer and may be formed with a width of approximately 6.5 μm to 7 μm in at least one side of the source electrode protruding to the gate line, but is not limited thereto. The compensation pattern according to the present disclosure may be formed only at one side of the source electrode and may also be formed to be spaced apart from the gate line by a distance (for example, 3.5 μm to 4 μm) by which the overlay shift of the gate line may be generated.

Figure 11:
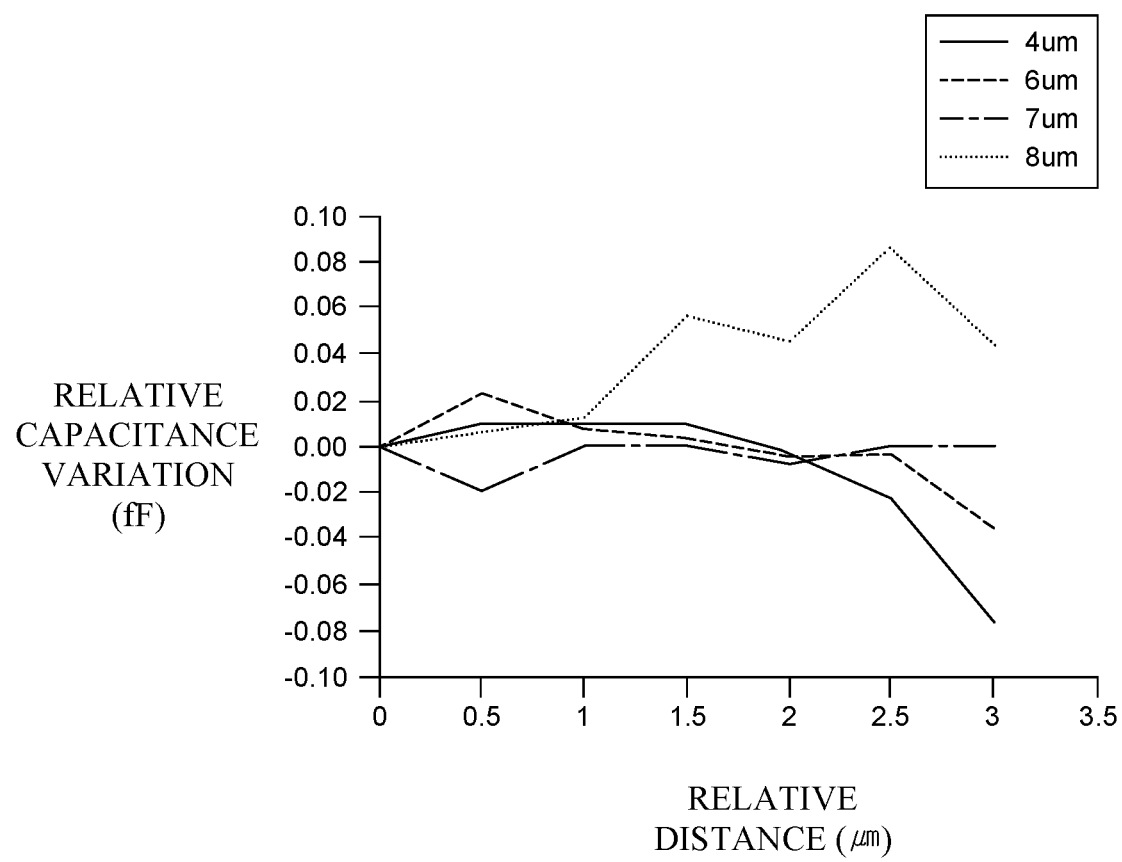
FIG. 11 is a graph illustrating a relative change in a capacitance according to a relative distance as an example.

FIG. 11 is a graph illustrating a relative change in a capacitance according to a relative distance as an example.

FIG. 11 illustrates a change in the capacitance according to a relative distance of the gate line and the compensation pattern when the width of the compensation pattern is 4 μm, 6 μm, 7 μm, and 8 μm. At this time, a width of the source electrode may be approximately 4.5 μm, for example.

Referring to FIG. 11, it may be understood that the large the relative distance between the gate line and the compensation pattern, the larger the relative change of the capacitance. For example, it may be understood that when the exposure overlay shift is generated by 3.5 μm to 4 μm, in 0 to 2.5 μm of the relative distance between the gate line and the compensation pattern, an effective, that is, minimized change is obtained.

Further, it may be understood that when the width of the compensation pattern has a range of 6 μm to 7 μm, more desirably, 6.5 μm to 7 μm, the relative change of the capacitance is minimized.

Figure 12:
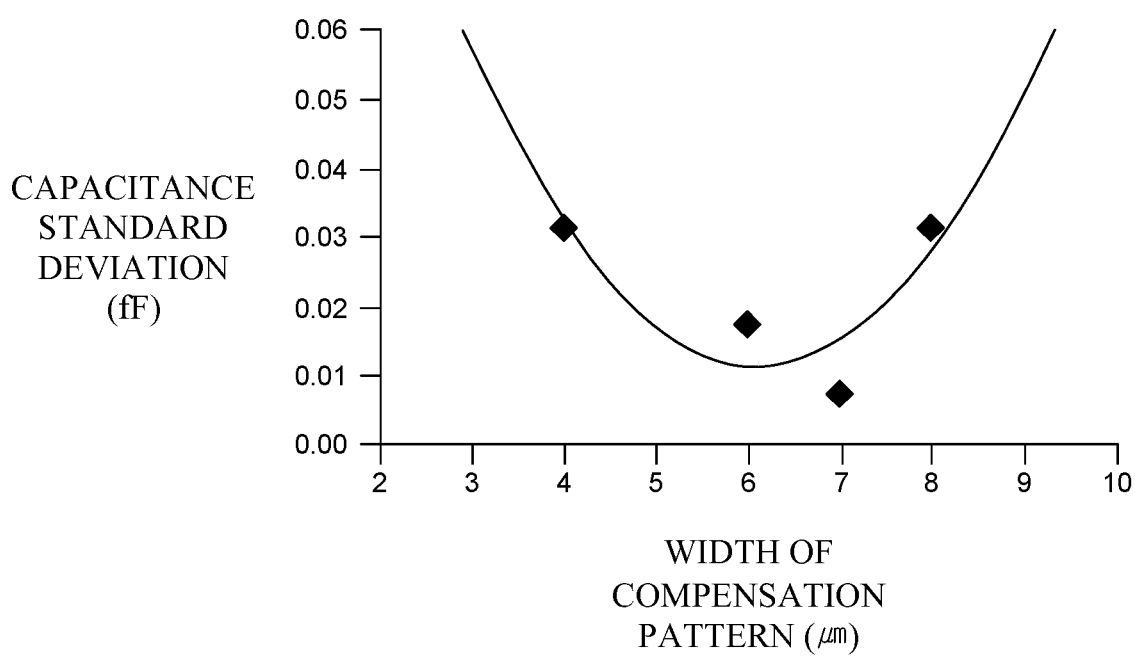
FIG. 12 is a graph illustrating a standard deviation of a capacitance according to a width of a compensation pattern.

FIG. 12 is a graph illustrating a standard deviation of a capacitance according to a width of a compensation pattern.

Referring to FIG. 12, as described above with reference to FIG. 11, it may be understood that when the width of the compensation pattern has a range of 6 μm to 7 μm, more desirably, 6.5 μm to 7 μm, the standard deviation of the capacitance is minimized. It may be further understood that when the width of the compensation pattern is larger than or smaller than the range of 6.5 μm to 7 μm, the standard deviation of the capacitance is sharply increased.

Therefore, when the width of the source electrode is approximately 4.5 μm, the width of the compensation pattern may be formed to have a range of approximately 6.5 μm to 7 μm.

Figure 13:
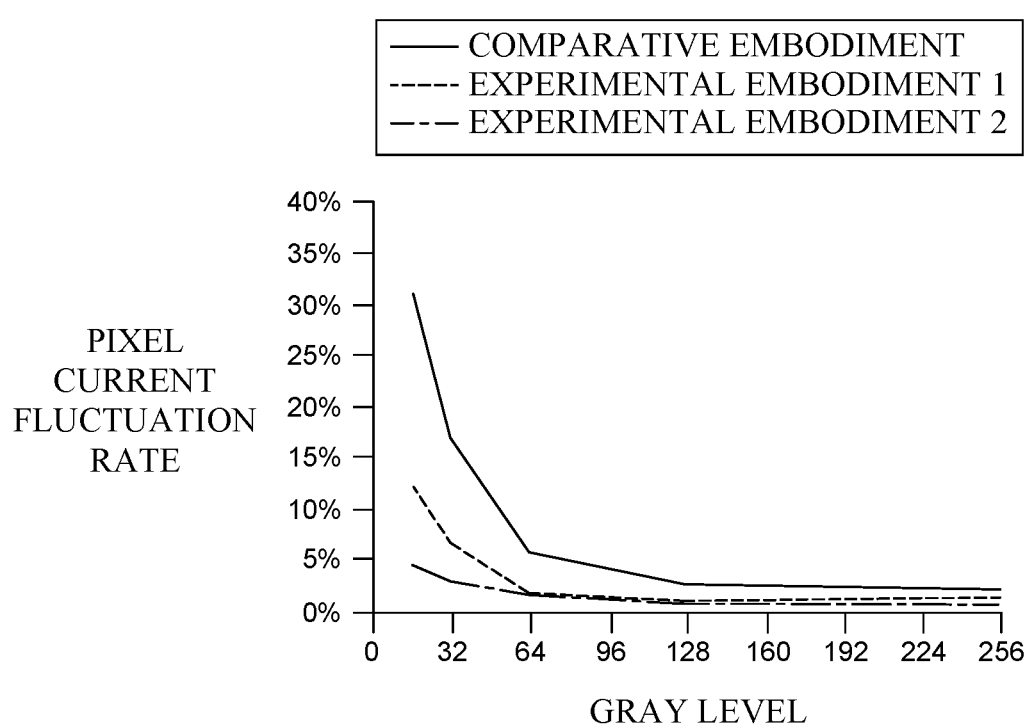
FIG. 13 is a graph illustrating comparison of a pixel current fluctuation rate according to a gray level.

FIG. 13 is a graph illustrating comparison of a pixel current fluctuation rate according to a gray level.

FIG. 14 is a table illustrating a pixel current fluctuation rate according to a gray level.

FIG. 13 illustrates a fluctuation rate of the pixel current per gray level from 16 gray levels to 256 gray levels by comparing with Comparative Aspect.

In FIG. 13, Comparative Aspect does not include a compensation pattern, Experimental Aspect 1 includes a compensation pattern having a width of approximately 6 μm, and Experimental Aspect 2 includes a compensation pattern having a width of approximately 7 μm.

FIG. 14 illustrates a table of a fluctuation rate of a pixel current per gray level in Comparative Aspect and Experimental Aspect 2 of FIG. 13.

Referring to FIGS. 13 and 14, it may be understood that in all Comparative Aspect, Experimental Aspect 1, and Experimental Aspect 2, the smaller the gray level, the larger the fluctuation rate of the pixel current.

Further, it may be further understood that according to Experimental Aspect 1 and Experimental Aspect 2, as compared with Comparative Aspect, the fluctuation rate is improved, and specifically, according to Experimental Aspect 2, the pixel current fluctuation rate is significantly reduced even at a low gray level.

For example, it may be understood that at 255 gray levels, pixel current fluctuation rates of Comparative Aspect and Experimental Aspect 2 are 2.2% and 0.7%, respectively, and at 128 gray levels, pixel current fluctuation rates of Comparative Aspect and Experimental Aspect 2 are 2.6% and 0.9%, respectively. Further, it may be understood that at 64 gray levels, pixel current fluctuation rates of Comparative Aspect and Experimental Aspect 2 are 5.6% and 2.0%, respectively, at 32 gray levels, pixel current fluctuation rates of Comparative Aspect and Experimental Aspect 2 are 17.0% and 3.2%, respectively, and at 16 gray levels, pixel current fluctuation rates of Comparative Aspect and Experimental Aspect 2 are 31.0% and 4.8%, respectively.

A low gray level of 32 or lower is an area which is sensitively recognized even by a slight luminance change and one gray level is recognizable. For example, a sub pixel of 32 gray levels and a sub pixel of 31 gray levels are visually perceived a different luminance and are converted into a luminance of 6% to 7%. Accordingly, in Experimental Aspect 2 in which a pixel current fluctuation rate is 6% to 7% at all gray levels, the luminance variation is not recognized with the naked eyes.

Accordingly, in order to improve the luminance difference between the adjacent sub pixels having the same color due to the overlay shift, a width of the compensation pattern may have a range of 6.5 μm to 7 μm.

The exemplary aspects of the present disclosure can also be described as follows:

According to an aspect of the present disclosure, there is provided an electroluminescent display device. The electroluminescent display device includes: a display panel in which a plurality of pixels are disposed, each pixel including a first sub pixel, a second sub pixel, a third sub pixel, and a fourth sub pixel each having a different color; a data driver which supplies a data voltage to the plurality of pixels by means of a plurality of data lines; and a gate driver which supplies a gate signal to the plurality of pixels by means of a plurality of gate lines, wherein each of the plurality of data lines may be divided into a plurality of sub data lines, and each of the plurality of sub data lines may be connected to a plurality of sub pixels having the same color, and wherein the sub pixel includes a switching transistor, and a source electrode of the switching transistor may include a compensation pattern which is provided on at least one side of the source electrode spaced apart from the gate line.

A plurality of first sub pixels provided in the plurality of pixels may be disposed in the same column, a plurality of second sub pixels provided in the plurality of pixels may be disposed in the same column, a plurality of third sub pixels provided in the plurality of pixels may be disposed in the same column, and a plurality of fourth sub pixels provided in the plurality of pixels may be disposed in the same column.

The first sub pixel may be a red sub pixel, the second sub pixel may be a white sub pixel, the third sub pixel may be a blue sub pixel, and the fourth sub pixel may be a green sub pixel.

The plurality of sub data lines may include a plurality of first sub data lines which are connected to a plurality of first sub pixels disposed in the plurality of pixels, a plurality of second sub data lines which are connected to a plurality of second sub pixels disposed in the plurality of pixels, a plurality of third sub data lines which are connected to a plurality of third sub pixels disposed in the plurality of pixels and a plurality of fourth sub data lines which are connected to a plurality of fourth sub pixels disposed in the plurality of pixels.

The first sub data line and the second sub data line may be disposed between the first sub pixel and the second sub pixel, and the third sub data line and the fourth sub data line may be disposed between the third sub pixel and the fourth sub pixel.

Sub pixels included in one pixel may be connected to the same gate line, and sub pixels included in two adjacent pixels may be connected to different gate lines.

A width of the compensation pattern may be 6.5 µm to 7 µm.

Two adjacent sub pixels having the same color may be connected to a first gate line and a second gate line which are adjacent to each other, and driving circuits of the two adjacent sub pixels are inverted. The compensation pattern may compensate for a difference between parasitic capacitance generated between the first gate line and source electrode of one of the inverted sub pixels and parasitic capacitance generated between the second gate line and source electrode of the other one of the inverted sub pixels.

In one of the two adjacent sub pixels, a first source electrode may be disposed on the first gate line and a first drain electrode may be disposed below the first gate line. In the other one of the two adjacent sub pixels, a second drain electrode may be disposed on the second gate line and a second source electrode may be disposed below the second gate line.

The compensation pattern may include a first compensation pattern provided on at least one side of the first source electrode and a second compensation pattern provided on at least one side of the second source electrode.

The electroluminescent display device may further include a first light shielding layer and a second light shielding layer disposed below the first source electrode and the second source electrode, respectively. The first compensation pattern may be provided on at least one side of the first source electrode which does not overlap the first light shielding layer, and the second compensation pattern may be provided on at least one side of the second source electrode which does not overlap the second light shielding layer.

The first compensation pattern and the second compensation pattern may be spaced apart from the first gate line and the second gate line in a most possible position where an exposure overlay shift of the first gate line and the second gate line is generated.

According to another aspect of the present disclosure, there is provided an electroluminescent display device. The electroluminescent display device includes: a display panel in which a plurality of pixels are disposed, each pixel including a plurality of sub pixels having different colors; a data driver which supplies a data voltage to the plurality of pixels by means of a plurality of data lines; and a gate driver which supplies a gate signal to the plurality of pixels by means of a plurality of gate lines, wherein each of the plurality of data lines may be divided into a plurality of sub data lines, and each of the plurality of sub data lines may be connected to a plurality of sub pixels having the same color, and wherein the sub pixel may include a switching transistor, and a source electrode of the switching transistor may include a compensation pattern provided on at least one side of the source electrode spaced apart from the gate line, and wherein the compensation pattern may compensate for a difference of a parasitic capacitance generated between the gate line and the source electrode in accordance with a distance between the gate line and the source electrode between two adjacent sub pixels having the same color.

The two adjacent sub pixels having the same color may be connected to a first gate line and a second gate line which are adjacent to each other. In a first sub pixel of the two adjacent sub pixels, a first source electrode may be disposed on the first gate line and a first drain electrode may be disposed below the first gate line. In a second sub pixel of the two adjacent sub pixels, a second drain electrode may be disposed on the second gate line and a second source electrode may be disposed below the second gate line.

The compensation pattern may include a first compensation pattern provided on at least one side of the first source electrode and a second compensation pattern provided on at least one side of the second source electrode.

The electroluminescent display device may further include a first light shielding layer and a second light shielding layer disposed below the first source electrode and the second source electrode, respectively. The first compensation pattern may be provided on at least one side of the first source electrode which does not overlap the first light shielding layer, and the second compensation pattern may be provided on at least one side of the second source electrode which does not overlap the second light shielding layer.

The first compensation pattern and the second compensation pattern may be spaced apart from the first gate line and the second gate line in a most possible position where an exposure overlay shift of the first gate line and the second gate line is generated.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. An electroluminescent display device, comprising:
  a display panel in which a plurality of pixels are disposed, each pixel including a first sub pixel, a second sub pixel, a third sub pixel, and a fourth sub pixel each having a different color;
  a data driver which supplies a data voltage to the plurality of pixels through a plurality of data lines; and
  a gate driver which supplies a gate signal to the plurality of pixels through a plurality of gate lines,
  wherein each of the plurality of data lines is divided into a plurality of sub data lines, and each of the plurality of sub data lines is connected to a plurality of sub pixels having a same color, and
  wherein each sub pixel includes a switching transistor, and a source electrode of the switching transistor includes a compensation pattern which is provided on at least one side of the source electrode spaced apart from the gate lines.

2. The electroluminescent display device according to claim 1, wherein the plurality of pixels include a plurality of first sub pixels which are disposed in a same column, a plurality of second sub pixels which are disposed in a same column, a plurality of third sub pixels which are disposed in a same column and a plurality of fourth sub pixels which are disposed in a same column.

3. The electroluminescent display device according to claim 1, wherein the first sub pixel is a red sub pixel, the second sub pixel is a white sub pixel, the third sub pixel is a blue sub pixel, and the fourth sub pixel is a green sub pixel.

4. The electroluminescent display device according to claim 1, wherein sub pixels included in one pixel are connected to a same gate line, and sub pixels included in two adjacent pixels are connected to different gate lines.

5. The electroluminescent display device according to claim 1, wherein a width of the compensation pattern is 6.5 µm to 7 µm.

6. The electroluminescent display device according to claim 1, wherein the plurality of sub data lines include:
a plurality of first sub data lines which are connected to a plurality of first sub pixels disposed in the plurality of pixels;
a plurality of second sub data lines which are connected to a plurality of second sub pixels disposed in the plurality of pixels;
a plurality of third sub data lines which are connected to a plurality of third sub pixels disposed in the plurality of pixels; and
a plurality of fourth sub data lines which are connected to a plurality of fourth sub pixels disposed in the plurality of pixels.

7. The electroluminescent display device according to claim 6, wherein the first sub data line and the second sub data line are disposed between the first sub pixel and the second sub pixel, and the third sub data line and the fourth sub data line are disposed between the third sub pixel and the fourth sub pixel.

8. The electroluminescent display device according to claim 1, wherein two adjacent sub pixels having a same color are connected to a first gate line and a second gate line which are adjacent to each other, and driving circuits of the two adjacent sub pixels are inverted, and
wherein the compensation pattern compensates for a difference between parasitic capacitance generated between the first gate line and source electrode of one of the inverted sub pixels and parasitic capacitance generated between the second gate line and source electrode of another one of the inverted sub pixels.

9. The electroluminescent display device according to claim 8, wherein, in one of the two adjacent sub pixels, a first source electrode is disposed on the first gate line and a first drain electrode is disposed below the first gate line, and
wherein, in another one of the two adjacent sub pixels, a second drain electrode is disposed on the second gate line and a second source electrode is disposed below the second gate line.

10. The electroluminescent display device according to claim 9, wherein the compensation pattern includes:
a first compensation pattern provided on at least one side of the first source electrode; and
a second compensation pattern provided on at least one side of the second source electrode.

11. The electroluminescent display device according to claim 10, wherein the first compensation pattern and the second compensation pattern are spaced apart from the first gate line and the second gate line in a most possible position where an exposure overlay shift of the first gate line and the second gate line is generated.

12. The electroluminescent display device according to claim 10, further comprising a first light shielding layer and a second light shielding layer respectively disposed below the first source electrode and the second source electrode.

13. The electroluminescent display device according to claim 12, wherein the first compensation pattern is provided on at least one side of the first source electrode which does not overlap with the first light shielding layer, and the second compensation pattern is provided on at least one side of the second source electrode which does not overlap with the second light shielding layer.

14. An electroluminescent display device, comprising:
a display panel in which a plurality of pixels are disposed, each pixel including a plurality of sub pixels having different colors;
a data driver which supplies a data voltage to the plurality of pixels through a plurality of data lines; and
a gate driver which supplies a gate signal to the plurality of pixels through a plurality of gate lines,
wherein each of the plurality of data lines is divided into a plurality of sub data lines, and each of the plurality of sub data lines is connected to a plurality of sub pixels having a same color,
wherein each sub pixel includes a switching transistor, and a source electrode of the switching transistor includes a compensation pattern provided on at least one side of the source electrode spaced apart from the gate line, and
wherein the compensation pattern compensates for a difference of a parasitic capacitance generated between the gate line and the source electrode in accordance with a distance between the gate line and the source electrode between two adjacent sub pixels having a same color.

15. The electroluminescent display device according to claim 14, wherein the two adjacent sub pixels having a same color are connected to a first gate line and a second gate line which are adjacent to each other,
wherein, in a first sub pixel of the two adjacent sub pixels, a first source electrode is disposed on the first gate line and a first drain electrode is disposed below the first gate line, and
wherein, in a second sub pixel of the two adjacent sub pixels, a second drain electrode is disposed on the second gate line and a second source electrode is disposed below the second gate line.

16. The electroluminescent display device according to claim 15, wherein the compensation pattern includes:
a first compensation pattern provided on at least one side of the first source electrode; and
a second compensation pattern provided on at least one side of the second source electrode.

17. The electroluminescent display device according to claim 16, wherein the first compensation pattern and the second compensation pattern are spaced apart from the first gate line and the second gate line in a most possible position where an exposure overlay shift of the first gate line and the second gate line is generated.

18. The electroluminescent display device according to claim 16, further comprising a first light shielding layer and a second light shielding layer respectively disposed below the first source electrode and the second source electrode.

19. The electroluminescent display device according to claim 18, wherein the first compensation pattern is provided on at least one side of the first source electrode which does not overlap with the first light shielding layer, and the second compensation pattern is provided on at least one side of the second source electrode which does not overlap with the second light shielding layer.

* * * * *